United States Patent
Letemplier

(10) Patent No.: US 8,044,714 B2
(45) Date of Patent: Oct. 25, 2011

(54) DEVICE AND METHOD FOR AMPLIFYING PULSED RF SIGNALS

(75) Inventor: Alain Letemplier, Mayenne (FR)

(73) Assignee: Thales (FR)

( * ) Notice: Subject to any disclaimer, the term of this patent is extended or adjusted under 35 U.S.C. 154(b) by 377 days.

(21) Appl. No.: 12/065,318

(22) PCT Filed: Aug. 30, 2006

(86) PCT No.: PCT/EP2006/065837
§ 371 (c)(1),
(2), (4) Date: Aug. 28, 2008

(87) PCT Pub. No.: WO2007/025995
PCT Pub. Date: Mar. 8, 2007

(65) Prior Publication Data
US 2009/0195314 A1    Aug. 6, 2009

(30) Foreign Application Priority Data

Aug. 30, 2005   (FR) ..................... 05 08876

(51) Int. Cl.
*H03F 3/38*   (2006.01)

(52) U.S. Cl. .......................................... 330/10; 330/297
(58) Field of Classification Search ................... 330/10, 330/277, 297, 51, 295
See application file for complete search history.

(56) References Cited

U.S. PATENT DOCUMENTS

| | | |
|---|---|---|
| 5,155,492 A | 10/1992 | Hopwood et al. |
| 5,892,403 A | 4/1999 | Brandt |
| 6,107,880 A | 8/2000 | Shaw |
| 6,597,244 B2 * | 7/2003 | Tichauer ...................... 330/297 |
| 6,831,509 B2 * | 12/2004 | Mitamura ...................... 330/10 |
| 7,177,370 B2 * | 2/2007 | Zhang et al. .................. 330/297 |
| 7,183,856 B2 * | 2/2007 | Miki et al. .................... 330/297 |
| 7,239,200 B2 * | 7/2007 | Ishii et al. ..................... 330/10 |
| 7,321,262 B2 * | 1/2008 | Nielsen et al. ................. 330/10 |

* cited by examiner

*Primary Examiner* — Khanh Nguyen
(74) *Attorney, Agent, or Firm* — Lowe Hauptman Ham & Berner, LLP

(57) ABSTRACT

Device and method are described for amplifying pulsed RF signals, comprising one or more transistors, each comprising a drain, a gate and a source. A device synchronizes the supply for the drain with an RF pulse.

7 Claims, 1 Drawing Sheet

DEVICE AND METHOD FOR AMPLIFYING PULSED RF SIGNALS

CROSS-REFERENCE TO RELATED APPLICATIONS

The present Application is based on International Application No. PCT/EP2006/065837, filed on Aug. 30, 2006, which in turn corresponds to French Application No. 05 08876, filed on Aug. 30, 2005, and priority is hereby claimed under 35 USC §119 based on these applications. Each of these applications are hereby incorporated by reference in their entirety into the present application.

FIELD OF THE INVENTION

The present invention relates to a device for amplifying pulsed signals. The present invention is used notably to amplify pulse-modulated radiofrequency (RF) signals. The present invention applies in general to all pulsed RF transmission chains, for example in the field of radar technology.

BACKGROUND OF THE INVENTION

The solutions usually employed for amplifying the power of a pulsed RF signal use for example:
common-base class-C bipolar transistors with DC voltage emitter supply,
common-source class-AB LDMOS transistors with DC drain supply and controlled drain current.

The first solution offers simplicity of implementation and zero consumption in the absence of pulses. However, it has quite a low gain and a moderate efficiency, and also a distortion of the base of the pulse due to the prebias.

The second solution is more complex to implement, but offers a high gain and respects the integrity of the pulse. However, it has a residual consumption between pulses. Its gain varies with temperature. The efficiency of the stage is reduced by the unnecessary consumption due to the biasing of the transistor.

In IFF amplification, the gate supply voltage is adjusted for a given drain current (quiescent bias current).

This voltage is also present only during the transmission period in order to cancel out the drain current outside the transmission period.

Also known are systems for automatic control of the quiescent drain current an automatic bias system such as that described in the patent U.S. Pat. No. 6,573,796. However, this system can be used in pulse mode only if the resulting drain current pulses are filtered by the system for measuring the drain current.

The devices of the prior art have notably certain drawbacks.

For IFF (Identification Friend or Foe) amplification, there is residual consumption between pulses—the turn-on time of the transistor obtained with a pulsed gate voltage control is slow compared with the time to establish a square pulse (radar or IFF type). It is therefore essential to anticipate the control relative to the RF pulse to be amplified in order to avoid distorting it, thereby leaving a period over which the transistor consumes power.

As regards the automatic bias system, this cannot be used as it stands and has the drawback of having a residual consumption between pulses (quiescent current).

In general, the power consumption between pulses (increased heating, reduced efficiency) is greater the higher the maximum gain sought.

The amplification stage thus constituted does not contribute to reducing the residual radiation between pulses.

SUMMARY OF THE INVENTION

The invention relates to a device for amplifying pulsed RF signals, comprising one or more transistors, each comprising a drain, a gate and a source, characterized in that it comprises a device for synchronizing the supply for the drain with an RF pulse.

The device according to the invention offers notably the following advantages:
the consumption is virtually zero between pulses, the supply for the drain being zero or almost zero;
between pulses, the stage thus formed adds its input/output isolation to the depth of modulation of the incoming modulated RF signal, which helps to reduce the residual radiation between pulses and allows a modulator of lower performance to be used upstream; and
since the consumption on the drain is limited to the strict duration of the RF pulse to be amplified, there is no risk of raising the gate voltage to its maximum value. The device therefore works at maximum gain, without unnecessarily increasing transistor heat-up.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE DRAWINGS

Figure 1:
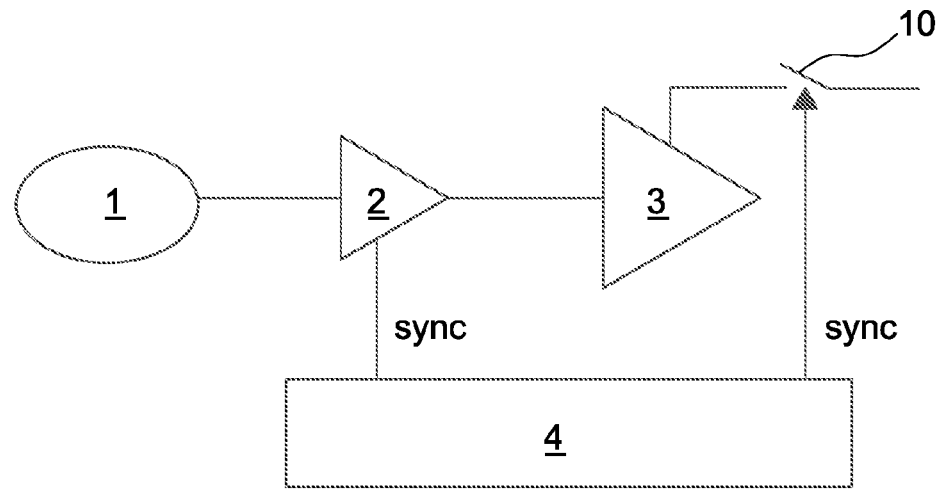
FIG. 1, one architecture of an amplification device.

FIG. 1 shows an example of the use of an LDMOS transistor in pulsed mode.

A source 1 sends radiofrequency (RF) signals to a modulator 2, which has notably the function of converting the signals into pulses. The pulsed RF signals are then transmitted to an amplifier 3 according to the invention. A device 4 has notably the function of controlling the modulation command signal sent to the modulator 2, but also of controlling the opening or closing of the low-loss switch of the amplifier 3. It receives a signal for controlling the transmission synchronization of the modulated signal.

Figure 2:
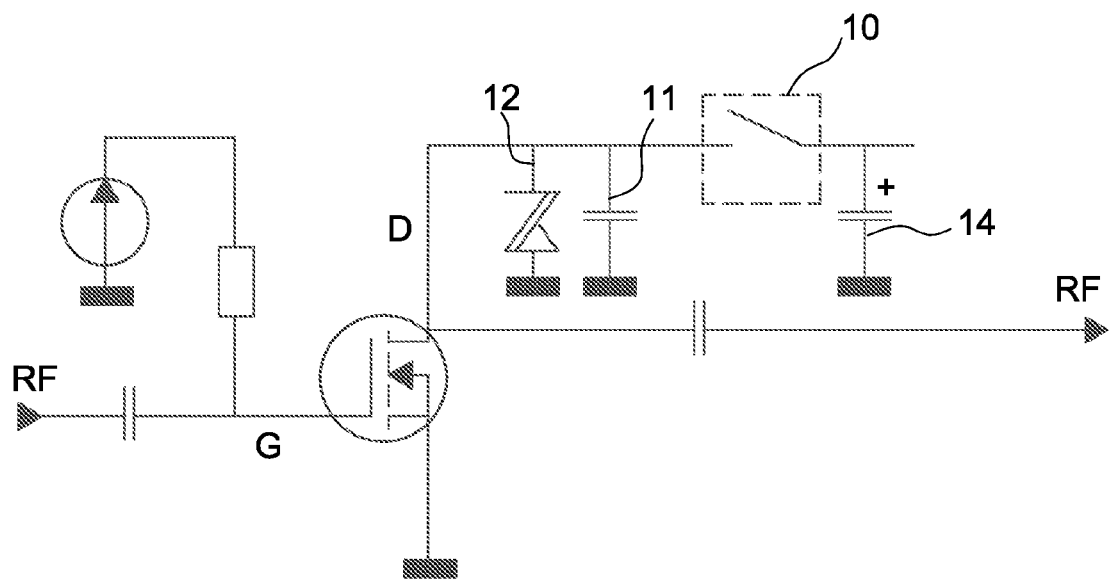
FIG. 2, an LDMOS transistor in pulsed and RF power amplification mode.

FIG. 2 shows an LDMOS transistor in pulsed RF power amplification mode.

The gate G of the transistor receives the frequency-modulated signal and is supplied by a gate supply. The drain D is connected to a DC supply by means of a low-loss switch 10. The switch 10 is controlled by means of the signal sync for synchronizing the transmission of the modulated signal (FIG. 1). The drain current is present only when the drain is supplied. A high-speed dual-polarity voltage limiter 12, with a value between the peak supply for the drain and the drain-source breakdown voltage of the LDMOS transistor, offers effective protection against overvoltages inherent in this type of operation. The capacitor 11 permits RF decoupling.

The instantaneous power needed is delivered by a reservoir capacitor 14 having a low capacitance, calculated according to the level of charge of the emitter, and a low series resistance (technological choice for minimizing the losses).

The low-loss switch is produced for example from MOS power transistors. It is therefore easy to produce and offers all the qualities of withstanding the high peak drain current and having low losses.

The supply VG for the gate may be:
a DC variable gain control voltage, for example a variable-gain amplifier;
a modulation signal for a stage used as a modulator;
the gate voltage is amplitude-controllable; adjusting of the quiescent drain current; adjusting of the RF gain of the stage.

The method according to the invention consists notably in controlling the opening and closing of the switch 10 according to the signal for synchronizing the transmission of the pulsed signal. For example, the supply for the drain of the transistor is controlled according to the signal transmitted. The drain is supplied according to the position of the RF pulses to be transmitted. It is also possible to control the gate voltage of the transistor by applying a variable DC voltage. According to an alternative method of implementation, the gate voltage of the transistor is controlled by applying a modulation signal of given waveform.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A device for amplifying radio frequency (RF) pulses, comprising:
a transistor having a drain, a gate, and a source, the gate being configured to receive the RF pulses;
a capacitor configured to store energy suitable for powering the transistor during a duration of transmission;
a switch coupled between the drain and the capacitor and arranged for selectively coupling the capacitor to the drain; and
a controlling device coupled to the switch and arranged for controlling formation of the RF pulses and for turning on/off the switch in order to power the transistor in a synchronized manner with each of the RF pulses.

2. The device as claimed in claim 1, wherein the gate is coupled to a direct current (DC) variable gain control voltage supply.

3. The device as claimed in claim 1, wherein the gate is supplied with a modulation signal having a predetermined waveform.

4. The device as claimed in claim 1, wherein the capacitor has a capacitance value determined according to a predetermined instantaneous power level for powering the transistor.

5. A method of amplifying radio frequency (RF) pulses, comprising:
storing energy in a capacitor, the stored energy being suitable for powering a transistor during a duration of transmission;
controlling formation of the RF pulses by a controlling device;
turning on/off a switch for selectively coupling the capacitor to a drain of the transistor in order to power the transistor in a synchronized manner with each of the RF pulses; and
amplifying the RF pulses by the transistor.

6. The method as claimed in claim 5, further comprising operating a direct current (DC) variable gain control voltage supply for applying a variable DC voltage to a gate of the transistor.

7. The method as claimed in claim 5, further comprising supplying a modulation signal having a predetermined waveform to a gate of the transistor.

* * * * *